(12) United States Patent
Mick

(10) Patent No.: US 9,338,922 B2
(45) Date of Patent: May 10, 2016

(54) RACK ADAPTER APPARATUS AND METHOD

(71) Applicant: Rackspace US, Inc., San Antonio, TX (US)

(72) Inventor: Jason Mick, Converse, TX (US)

(73) Assignee: Rackspace US, Inc., San Antonio, TX (US)

( * ) Notice: Subject to any disclaimer, the term of this patent is extended or adjusted under 35 U.S.C. 154(b) by 275 days.

(21) Appl. No.: 13/830,044

(22) Filed: Mar. 14, 2013

(65) Prior Publication Data

US 2014/0268528 A1    Sep. 18, 2014

(51) Int. Cl.
*H02B 1/20* (2006.01)
*H05K 7/14* (2006.01)

(52) U.S. Cl.
CPC ......... *H05K 7/1491* (2013.01); *Y10T 29/49002* (2015.01)

(58) Field of Classification Search
USPC ............ 361/827, 679.01, 748, 784, 796, 752, 361/788, 800, 816, 818, 826; 174/350, 50, 174/59, 520
See application file for complete search history.

(56) References Cited

U.S. PATENT DOCUMENTS

| | | | | |
|---|---|---|---|---|
| 5,366,388 | A * | 11/1994 | Freeman et al. | 439/540.1 |
| 6,038,126 | A * | 3/2000 | Weng | 361/679.01 |
| 6,307,750 | B1 * | 10/2001 | Bendikas et al. | 361/725 |
| 7,460,375 | B2 * | 12/2008 | Randall et al. | 361/724 |
| 7,920,387 | B2 * | 4/2011 | Barrett et al. | 361/756 |
| 8,472,198 | B2 * | 6/2013 | Peng et al. | 361/724 |
| 8,755,192 | B1 * | 6/2014 | Schrempp et al. | 361/736 |
| 8,925,739 | B2 * | 1/2015 | Crippen et al. | 211/26 |
| 2002/0146207 | A1 * | 10/2002 | Chu | 385/53 |
| 2005/0201073 | A1 * | 9/2005 | Pincu et al. | 361/797 |
| 2005/0259383 | A1 * | 11/2005 | Ewing et al. | 361/622 |
| 2007/0242420 | A1 * | 10/2007 | Hoshino et al. | 361/600 |
| 2010/0110628 | A1 * | 5/2010 | Barrenechea et al. | 361/679.48 |
| 2013/0229780 | A1 * | 9/2013 | Trudeau et al. | 361/827 |

* cited by examiner

*Primary Examiner* — Hung S Bui

(74) *Attorney, Agent, or Firm* — Haynes and Boone, LLP

(57) ABSTRACT

Embodiments of the present disclosure disclose a rack adapter apparatus. The rack adapter apparatus includes a shelf configured to be mounted in a rack frame having a front opening of a first width and a rear opening of the first width, the shelf being further configured to support a computing device thereon, the computing device having a second width less than then first width and having a back-side port disposed thereon, the back-side port facing the rear opening when the computing device is supported by the shelf and the shelf is mounted in the rack frame. The rack adapter apparatus also includes a pass-through jack having a front port facing the front opening and a rear port facing the rear opening, the front and rear ports being electrically coupled, and the rear port being configured to be communicatively coupled to the back-side port of the computing device.

25 Claims, 9 Drawing Sheets

RACK ADAPTER APPARATUS AND METHOD

BACKGROUND

The present disclosure relates generally to rack management, and more particularly to rack adapter devices and methods.

Data centers with hundreds or thousands of computing devices often mount such computing devices into racks for organizational and space efficiency purposes. A single rack may contain a plurality of servers, a plurality of storage devices, one or more network appliances to connect the devices to a network, and a power supply to power the devices. Traditionally, racks have standardized dimensions such that any piece of hardware that conforms to the rack standards may be mounted therein. Occasionally, it may be desirable to mount a computing device or other hardware within a rack where the computing device does not conform to the standardized rack dimensions. In such situations, it may be possible to mount a chassis within the rack and then mount the computing device to the chassis. However, management ports disposed on the rear of the computing devices may not be accessible from the rear of the rack when the computing device is mounted with the chassis. For instance, energized power supply equipment disposed at the rear of the rack may make it hazardous to access the management ports. Accordingly, although existing rack adaptation structures and methods have been satisfactory for their intended purposes, they have not been entirely satisfactory in all respects.

SUMMARY OF THE INVENTION

Figure 1:
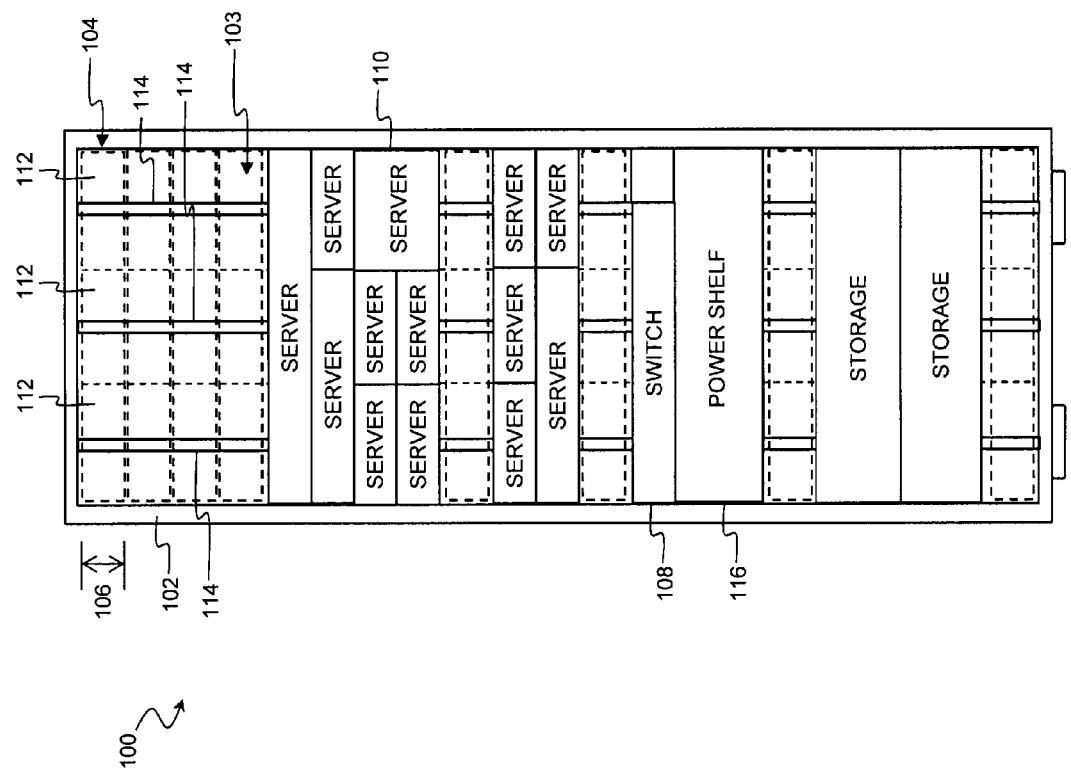
FIG. 1 is a diagrammatic front view of a rack system according to aspects of the present disclosure.

In one exemplary aspect, the present disclosure is directed to a rack adapter apparatus. The rack adapter apparatus includes a shelf configured to be mounted in a rack frame having a front opening of a first width and a rear opening of the first width, the shelf being further configured to support a computing device thereon, the computing device having a second width less than then first width and having a back-side port disposed thereon, the back-side port facing the rear opening when the computing device is supported by the shelf and the shelf is mounted in the rack frame. The rack adapter apparatus also includes a pass-through plate coupled to the shelf, the pass-through plate facing the front opening and a pass-through jack disposed within the pass-through plate, the pass-through jack having a front port facing the front opening and a rear port facing the rear opening, the front and rear ports being electrically coupled, and the rear port being configured to be communicatively coupled to the back-side port of the computing device such that electrical signals input into the front port are passed to the back-side port.

In another exemplary aspect, the present disclosure is directed to a rack adaptation method. The method includes providing rack adapter having a shelf configured to be mounted in a rack frame having a front opening of a first width and a rear opening of the first width, the shelf having a pass-through plate coupled thereto, the pass-through plate facing the front opening, the pass-through plate having a pass-through jack disposed therein, and the pass-through jack having a front port facing the front opening and a rear port facing the rear opening, the front and rear ports being electrically coupled. The method also includes supporting a computing device with the shelf when the shelf is mounted in the rack frame, the computing device having a second width less than then first width and having a back-side port disposed thereon, the back-side port facing the rear opening, communicatively coupling the back-side port to the rear port of the pass-through jack, and passing, via the pass-through jack, electrical signals input into the front port to the back-side port.

In a further exemplary aspect, the present disclosure is directed to a rack adapter apparatus. The rack adapter apparatus includes a shelf configured to be mounted in a rack frame having a front opening of a first width and a rear opening of the first width, the shelf being further configured to support a network switch thereon, the network switch having a second width less than then first width and having a management port and a console port disposed thereon, the management and console ports facing the rear opening when the network switch is supported by the shelf and the shelf is mounted in the rack frame. The rack adapter apparatus also includes a pass-through plate coupled to the shelf, the pass-through plate facing the front opening and first and second pass-through jacks disposed within the pass-through plate, the pass-through jacks each having front ports facing the front opening and rear ports facing the rear opening, the front and rear ports being electrically respectively coupled, and the rear ports being configured to be communicatively coupled to the respective management and console ports of the network switch such that electrical signals input into the front ports are passed to the respective management and console ports.

DETAILED DESCRIPTION

For the purposes of promoting an understanding of the principles of the present disclosure, reference will now be made to the embodiments illustrated in the drawings, and specific language will be used to describe the same. It is nevertheless understood that no limitation to the scope of the disclosure is intended. Any alterations and further modifications to the described devices, systems, and methods, and any further application of the principles of the present disclosure are fully contemplated and included within the present disclosure as would normally occur to one skilled in the art to which the disclosure relates. In particular, it is fully contemplated that the features, components, and/or steps described with respect to one embodiment may be combined with the features, components, and/or steps described with respect to other embodiments of the present disclosure. For the sake of brevity, however, the numerous iterations of these combinations will not be described separately Referring now to FIG. 1, illustrated is a diagrammatic front view of a rack system 100 according to aspects of the present disclosure. The rack system 100 is comprised of a plurality of discrete computing devices and includes a rack frame 102 in which the computing devices are releasably mounted. The frame 102 includes a front opening 103 into which the computing devices are inserted. A rear opening opposes the front opening 103. When mounted, the front panels of the computing devices face the front opening 103 and the back panels of the computing devices face the rear opening of the frame. The frame 102 has standardized dimensions such that any piece of hardware that conforms to the rack standards may be mounted therein. In that regard, in one embodiment, the front opening 103 has a width of 537 mm, however, in other embodiments the front opening may have a smaller or greater width, such as 482.6 mm. As such, to mount a computing device that does not have substantially the same width as the front opening, a rack adapter that is of the same width as the front opening is required. As discussed in greater detail below, a rack adapter may be mounted within the rack and then a width-deficient computing device may be supported by the rack adapter.

Additionally, frame 102 includes a plurality of virtual partitions 104 that extend the width of the frame 102 and are of equal height 106. In certain embodiments, each partition 104 has a height of 48 mm and a width of 537 mm, but, in other embodiments, each partition may have a different height such as 44.45 mm and may have a different width such as 482.6 mm. Each partition 104 may be referred to as a rack unit or uSpace and the height of rack-mountable computing devices may be measured in the number of rack units they occupy. For example, a computing device may occupy 1 rack unit, 0.5 of a rack unit, or 3 rack units. In the example embodiment of FIG. 1, a network switch 108 is mounted in the frame 102 and is 1 rack unit in height, whereas a server 110 is 2 rack units in height. As will be discussed in association with FIG. 2, the network switch 108 has a width smaller than the width of the front opening 103, and thus requires a rack adapter to be mounted within the frame 102.

Further, the frame 102 is configured to allow up to three individually-powered computing devices to be mounted side-by-side within one of the virtual partitions 104. In that regard, each partition 104 is segmented into three equally-sized power zones 112. Each power zone 112 is associated with a power bar 114 that is disposed at the rear of the rack (adjacent the rear opening) and provides power to a computing device mounted in the power zone and coupled thereto. The power bars 114 extend the height of the frame 102 and are energized by a power shelf 116 mounted in the frame. In one embodiment, the power shelf 116 outputs 12 volts DC to each power bar 114, but, in other embodiments, the power shelf may output a different DC voltage or may output an AC voltage. Further, in some embodiments, the rack system 100 may include a battery backup system that energizes the power bars in the event that the power shelf fails or ceases to receive power from an external source. In such a scenario, backup batteries may be mounted within the frame 102, or backup batteries may be housed in locations remote to the rack system 100.

One of ordinary skill in the art would recognize that the illustrated embodiment of FIG. 1 is simply an example embodiment and the rack system may include additional and/or different features, devices, capabilities, etc. For instance, the dimensions of frame 102 set forth herein are simply example dimensions and the frame may take on any number of physical configurations depending on the environment in which the rack system is deployed. The computing devices mounted within the frame 102 are similarly just examples, and any additional and/or different types of computing devices and accessories may be mounted in the frame. For example, blade servers, database controllers, network routers, patch panels, backup batteries, diagnostics equipment, graphics processor arrays, hard drive controllers, and any other rack-mountable computing equipment or peripheral that conforms to the rack unit height standard 106 may be mounted in the frame 102.

Figure 2:
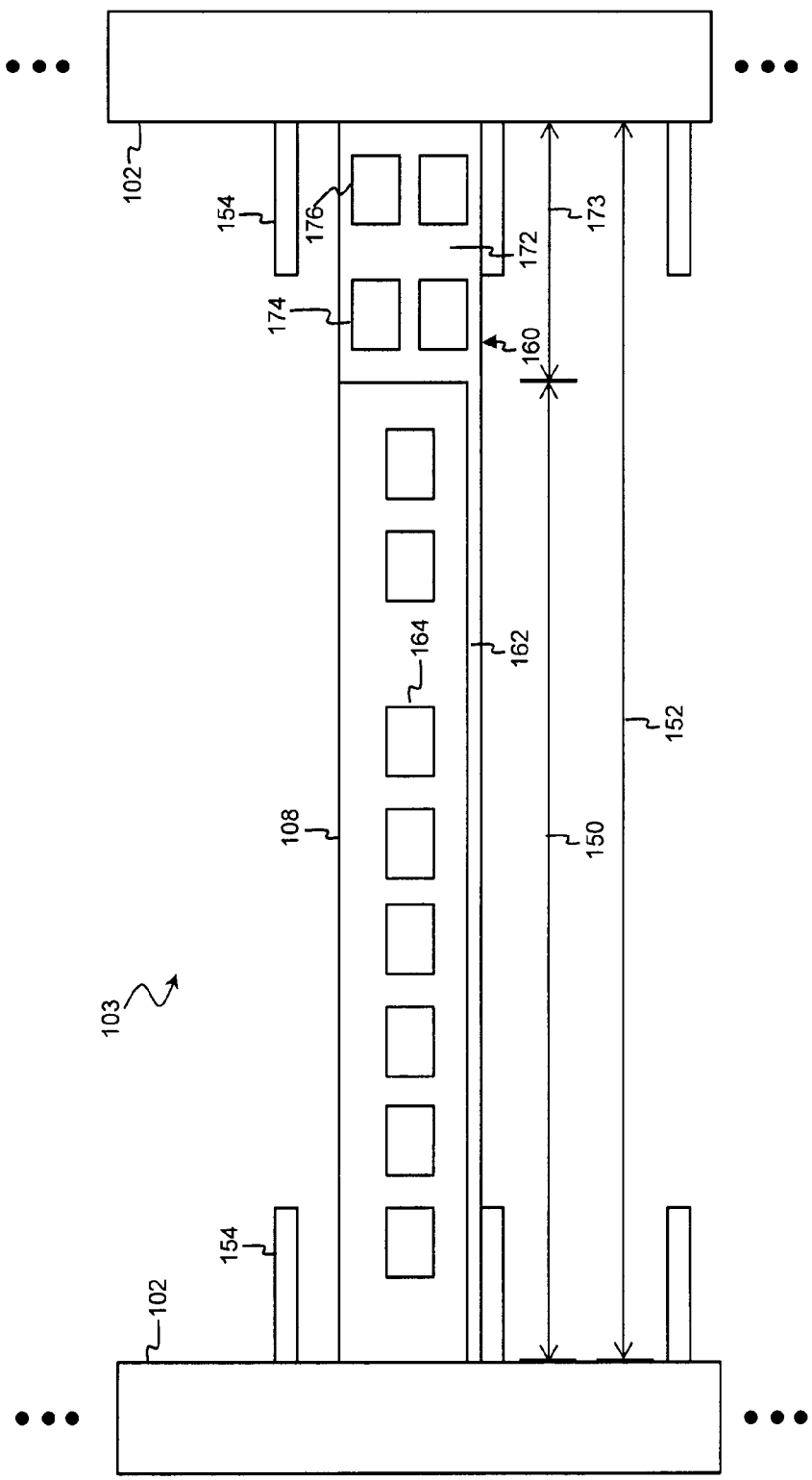
FIG. 2 is diagrammatic front view of a portion of the rack system of FIG. 1.
Figure 3:
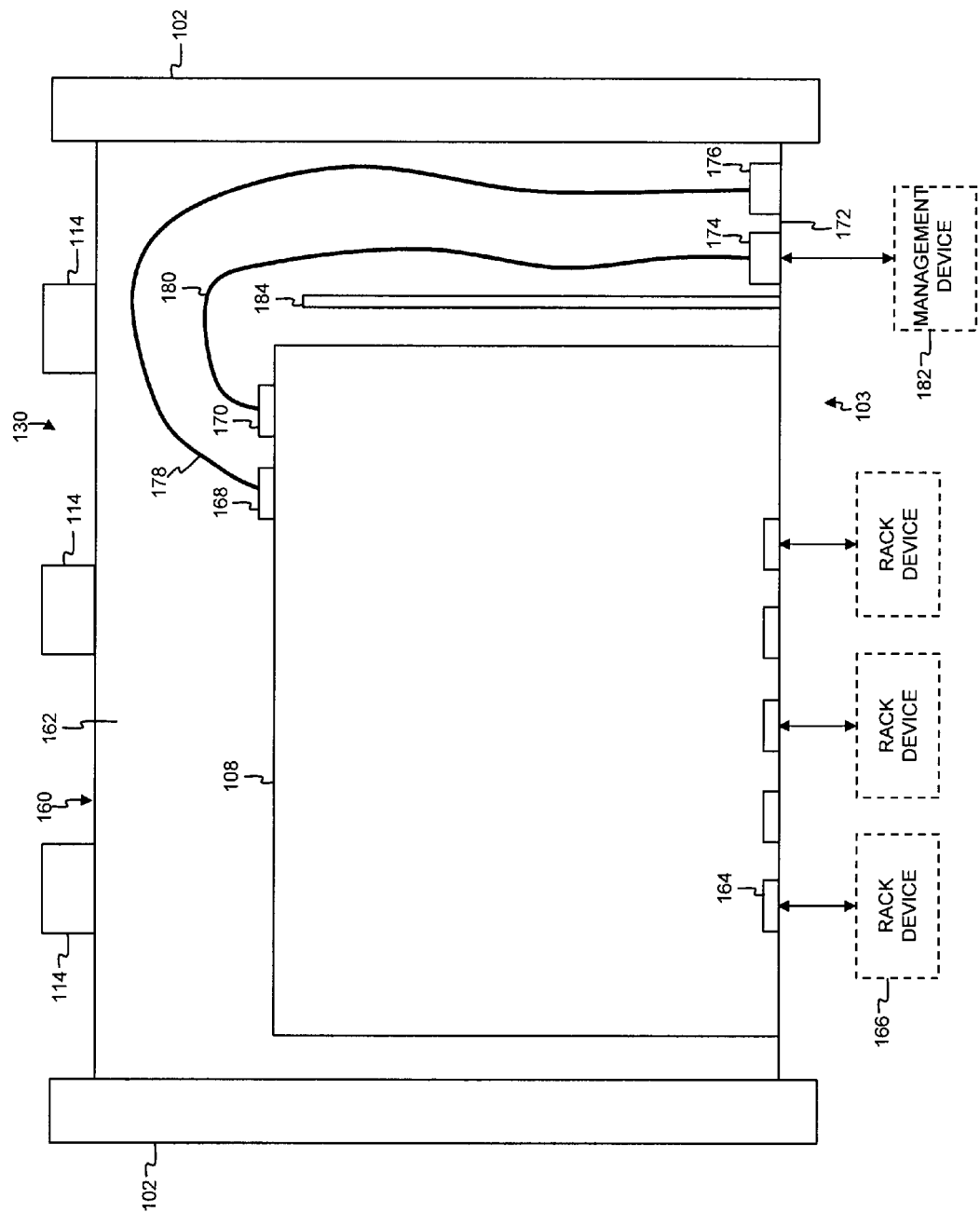
FIG. 3 is diagrammatic top view of a portion of the rack system of FIG. 1.

Referring now to FIGS. 2 and 3, FIG. 2 is diagrammatic front view of a portion of the rack system 100 of FIG. 1, and FIG. 3 is diagrammatic top view of a portion of the rack system of FIG. 1. In particular, the FIGS. 2 and 3 show the network switch 108 mounted within the frame 102. As described in association with FIG. 1, the frame 102 includes the front opening 103 and a rear opening 130, with power bars 114 disposed adjacent to the rear opening. In the illustrated embodiment, the network switch 108 has a width 150 which is less than a width 152 of the front opening 103 of the frame 102. As such, the network switch 108 may not be mounted by itself in the frame 102, for example by using mounting brackets 154 disposed within the frame. Accordingly, a rack adapter 160 is mounted within the frame 102 using the brackets 154. The network switch 108 is supported by the rack adaptor 160. The rack adapter 160 includes a shelf 162 on which the network switch 108 is supported. The network switch 108 includes a plurality of network ports 164 on its front face that are configured to be communicatively coupled to one or more rack devices 164. The network switch 108 further includes management ports 168 and 170 on a back panel of the switch such that the ports face the rear opening 130 of the frame 102. Rack administrators may configure the network switch 108 via the management ports 168 and 170. That is, management devices such as consoles or other computing devices may be coupled to management ports 168 and 170 via cables and electrical signals carrying configuration commands may be transmitted between the management ports and the management devices. The management ports 168 and 170 may each be any type of data port such as an RJ-45 port, an RJ-11 port, DE-9 port, a DB-25 port, a USB port (full-size, mini, micro, or otherwise), an IEEE 1394 (FireWire) port, a PS/2 port, an HDMI port, a VGA port, a DVI port, a parallel port, a SCSI port, or any other port type known in the art. For example, management port 168 may be a serial-based DE-9 local console port and port 170 may be an Ethernet-based RJ-45 remote management port. Although in FIG. 2 two ports are shown at the rear of the network switch 108, in other embodiments, any number of ports may be disposed at the rear of the switch and thus facing the rear opening 130 of the frame 102. Further, in other embodiments, the management ports may be other type of back-side ports configured for various purposes known in the art.

As shown in FIG. 3, the energized power bars 114 are disposed at the rear opening 130 of the frame 102, making it difficult and dangerous to access the management ports 168 and 170 from the rear opening. In that regard, the rack adapter 160 includes a pass-through plate 172 having pass-through jacks 174 and 176 disposed within the plate. The pass-through plate 172 has a width 173 that is approximately the difference between the width 152 of the front opening and the width 150 of the network switch 108. The pass-through jacks 174 and 176 each include a front port facing the front opening of the frame 102 and a rear port facing the rear opening of the frame, where each front port is electrically coupled to a respective a rear port. The front ports of the pass-through jacks 174 and 176 may be any type of port found on computing devices such as an RJ-45 port, an RJ-11 port, DE-9 port, a DB-25 port, a USB port (full-size, mini, micro, or otherwise), an IEEE 1394 (FireWire) port, a PS/2 port, an HDMI port, a VGA port, a DVI port, a parallel port, a SCSI port, or any other port type known in the art. As illustrated in FIG. 3, the management ports 168 and 170 are communicatively coupled to the rear ports of the pass-through jacks 174 and 176 via a pair of cables 178 and 180. In some instances the cables 178 and 180 are permanently coupled to the rear ports of the pass-through jacks 174 and 176, but, in other instance, the cables 178 and 180 are releasably coupled to the pass-through jacks 174 and 176 such that they may be swapped out for different cables. Further, in other embodiments, the pass-through jacks 174 and 176 are communicatively coupled to the management ports 168 and 170 via a short-range wireless connection.

In this manner, electrical signals input into the front ports of the pass-through jacks 174 and 176 are passed to the management ports 168 and 170, and vice versa. Additionally, in some instances, the front ports of the pass-through jacks 174 and 176 are the same type of ports as the respective management ports to which they are communicatively coupled. For instance, the front port of the pass-through jack 174 may be the same port type as the management port 170, and the front port of the pass-through jack 176 may be the same port type as the management port 168. In this manner, a cable connector compatible with one of the management ports is also compatible with the associated pass-through jack. In some instances, the pass-through plate 172 includes two pass-through jacks. In other instances, the pass-through plate 172 includes four pass-through jacks. However, in further embodiments, the pass-through plate 172 includes a different number of pass-through jacks, for example, the number of pass-through jacks on the pass-through plate may be associated with the number of back-side ports on a computing device supported by the rack adapter. As an example, in an embodiment in which management port 170 and the front port of pass-through jack 174 are serial-based RJ-45 console ports, a management device 182 having an RJ-45 cable connector may be coupled to the front port of the pass-through jack 174 instead of the management port 170, but still be communicatively coupled to the management port 170 via the cable 180. When so configured, the management device 182 may transmit command signals to the network switch 108 without being physically connected to the management port 170 through the rear opening 130 of the frame 102, thus avoiding the energized power bars 114. Additionally, the rack adapter 160 includes a hardware mount 184 to which width-deficient computing devices such as the network switch 108 may be secured. The hardware mount 184 is also configured to divert the cables 178 and 180 away from the network switch 108 to prevent cable pinches or snags.

One of ordinary skill in the art would understood that although FIGS. 1-3 illustrate a network switch being supported by the rack adaptor, the adaptation principles described herein also apply to any computing device or rack hardware that includes back-side ports that are partially or totally inaccessible when the hardware is mounted in a rack frame. For instance, in FIGS. 1-3, the network switch 108 may be replaced by a computer server or a storage device that have back-side ports that face the rear opening 130 when mounted in the rack frame. In either case, the back-side ports of the devices may be communicatively coupled to the rear ports of the pass-through jacks 174 and 176 such that electrical signals input into the front ports of the pass-through jacks are passed to the back-side ports of the devices supported by the rack adapter 160.

Figure 4:
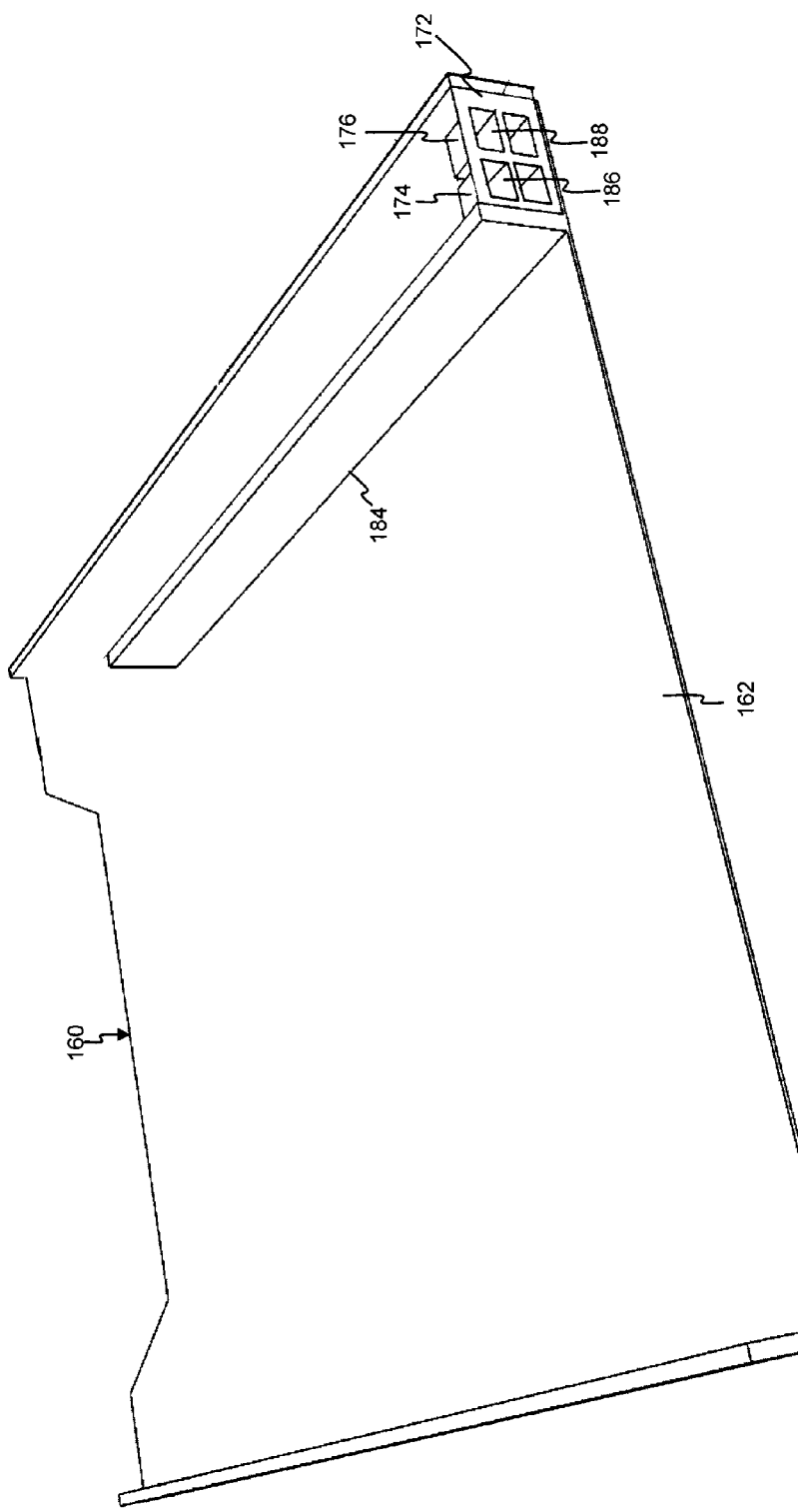
FIGS. 4 and 5 are two different diagrammatical perspective views of the rack adapter of FIGS. 2 and 3.
Figure 5:
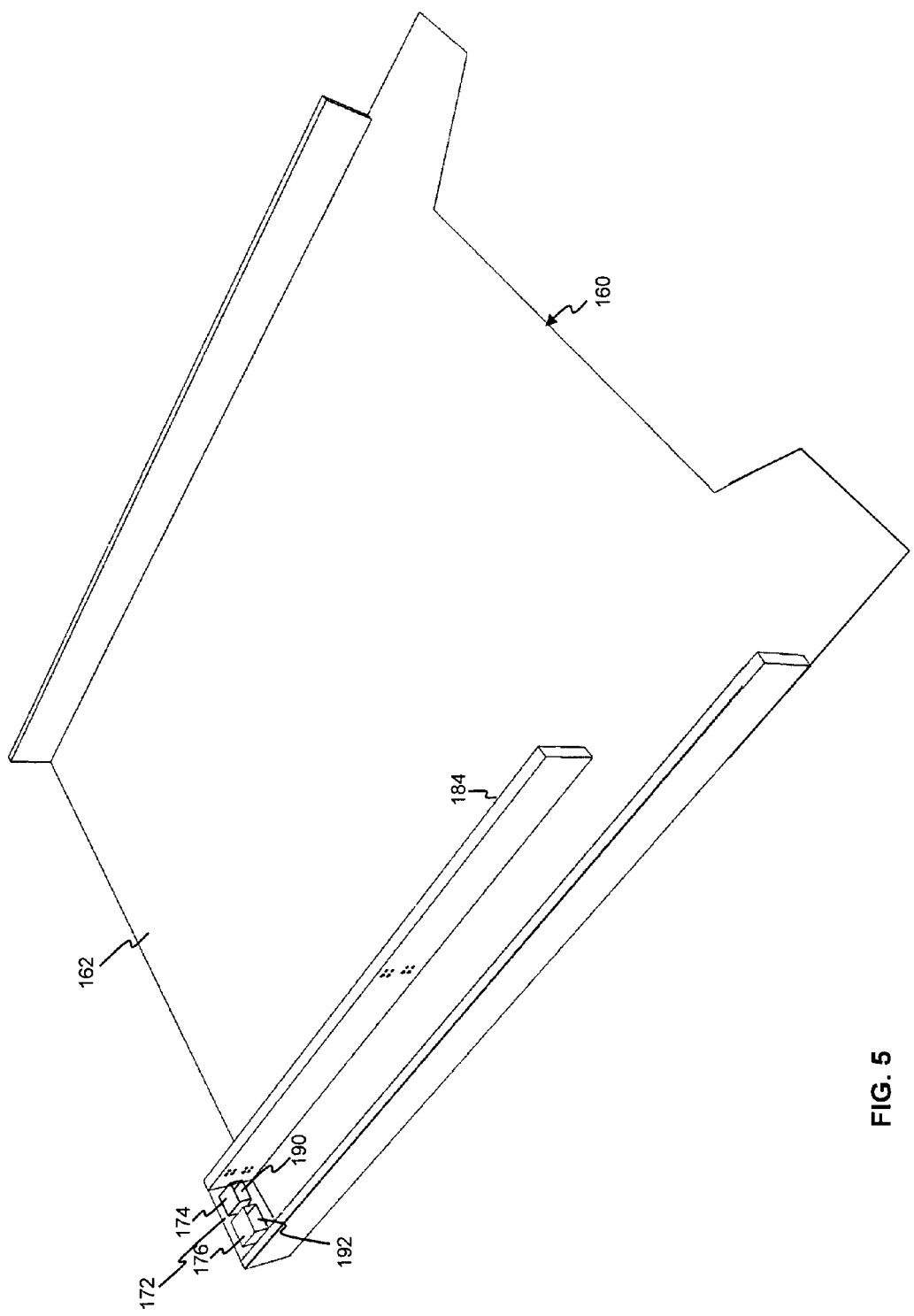

Referring now to FIGS. 4 and 5, illustrated are two different diagrammatic perspective views of the rack adapter 160 in isolation. As shown in FIG. 4, the pass-through jack 174 includes a front port 186 that faces the front opening of the rack frame 102 when the rack adapter 160 is mounted therein. Additionally, the pass-through jack 176 includes a front port 188 that faces the front opening of the rack frame 102 when it's mounted. As mentioned above, the front ports of the management jacks may be any type of port known in the art, and in some instances, the front ports match the port types of the back-side ports disposed on a computing device supported by the rack adapter 160. Additionally, as shown in FIG. 5, the pass-through jack 174 includes a rear port 190 that faces the rear opening of the rack frame 102 when the rack adapter 160 is mounted therein. Additionally, the pass-through jack 176 includes a rear port 192 that faces the rear opening of the rack frame 102 when mounted. In some instances, the rear ports are of the same port type as their associated front ports, but in other instances, the rear ports are different port types than their associated front ports and, in some cases, may include individual connections for each wire strand in a cable. For instance, the rear ports may include individual connections for each wire in a Cat 5 UTP (unshielded twisted pair) cable.

Figure 6:
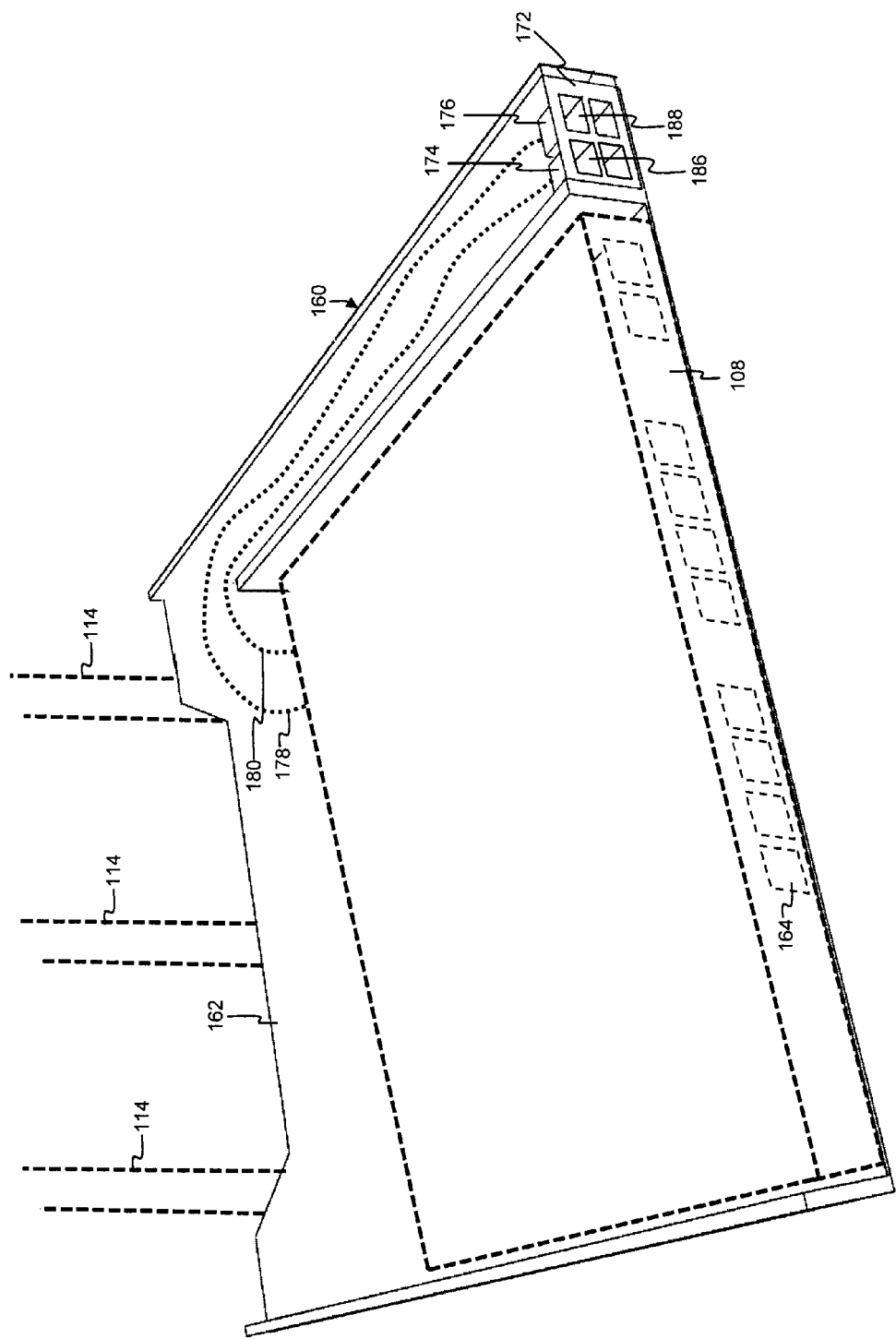
FIGS. 6 and 7 are the diagrammatic perspective views of the rack adapter shown in FIGS. 4 and 5 but also showing additional elements of the rack system.
Figure 7:
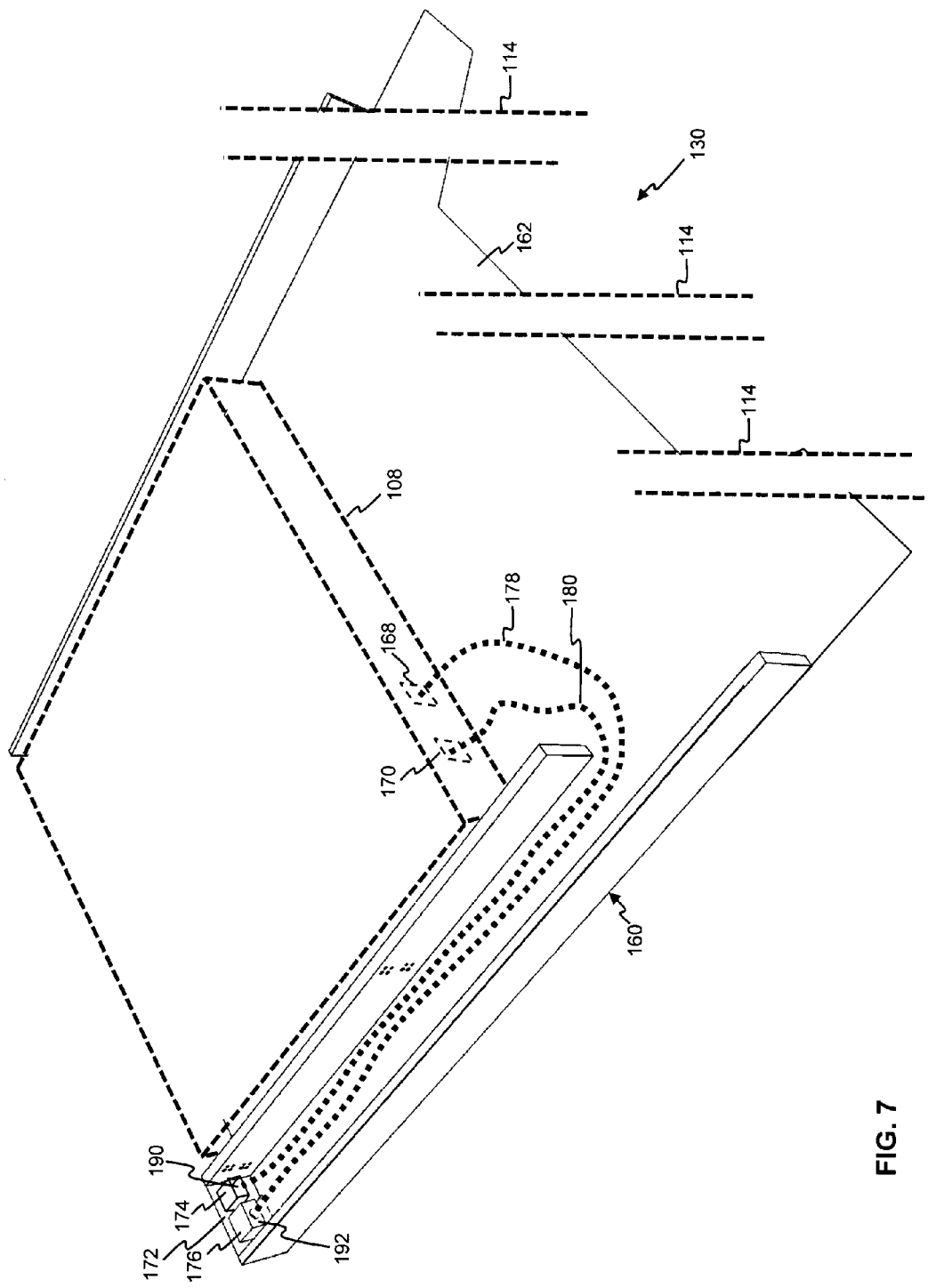

Referring now to FIGS. 6 and 7, illustrated are the diagrammatic perspective views of the rack adapter 160 shown in FIGS. 4 and 5 but also showing additional elements of the rack system 100 in broken lines. For instance, FIGS. 6 and 7 illustrate the positioning of network switch 108, cables 178 and 180, and power bars 114 with respect to the rack adapter 160. In particular, FIGS. 6 and 7 show the inaccessibility of the management ports 168 and 170 from the rear opening 130 of the frame 102 due to the energized power bars 114.

One of ordinary skill in the art would recognize that the rack adapter 160 illustrated in the embodiment of FIGS. 1-7 is an example embodiment and the rack adapter may be configured in various different manners and include additional and/or different elements. For example, in different embodiments, the pass-through plate and pass-through jacks may be disposed at various different locations with respect to the shelf and the computing device supported thereon. In other words, the pass-through plate may not be located horizontally adjacent to the front face of the supported computing device in all embodiments. The pass-through plate may also be located above and/or below the front face of a supported computing device.

Figure 8:
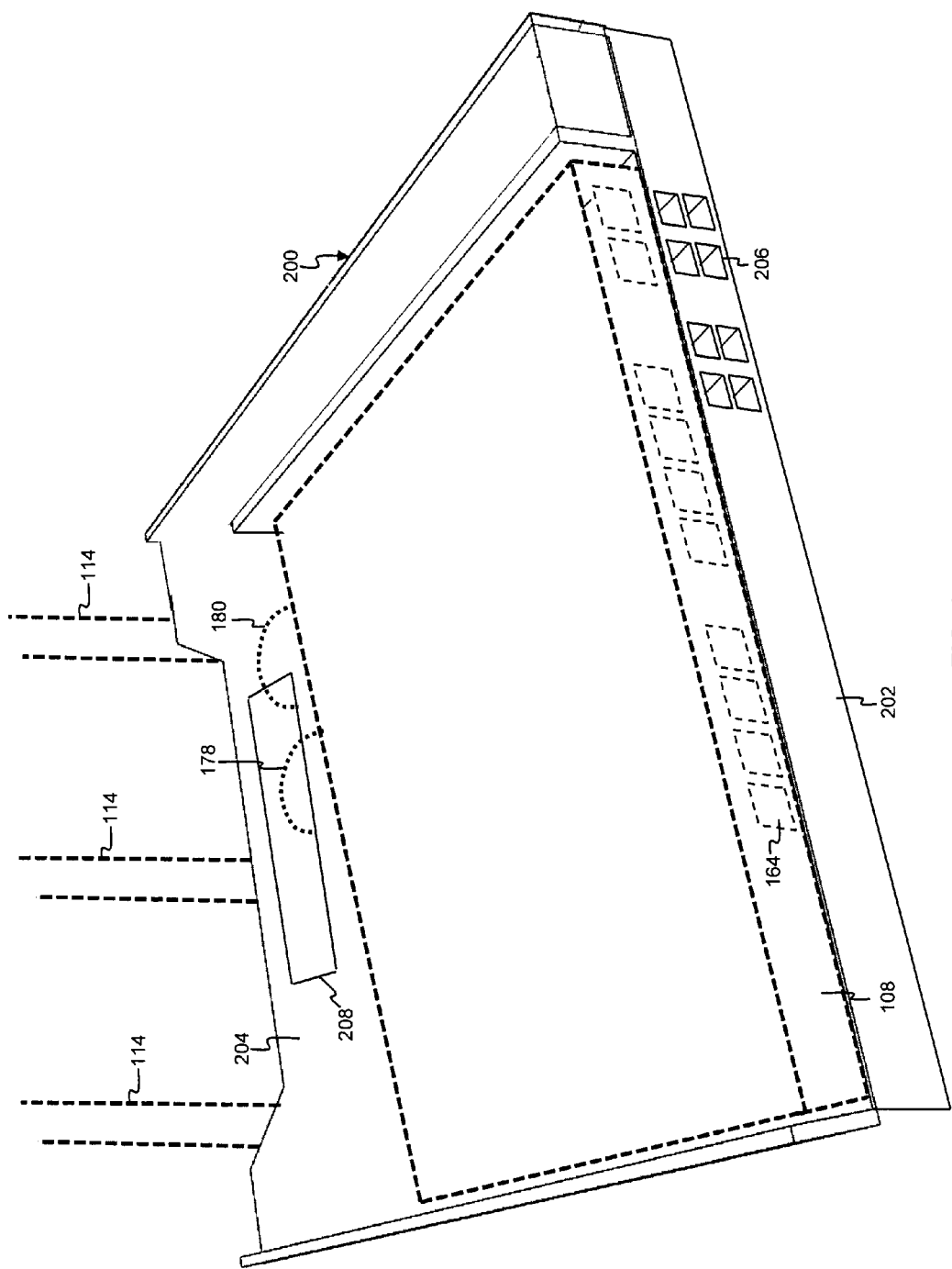
FIG. 8 is a diagrammatic perspective view of a rack adapter according to another embodiment of the present disclosure.

In that regard, FIG. 8 illustrates a diagrammatical perspective view of a rack adapter 200 according to another embodiment of the present disclosure. In particular, FIG. 8 shows the rack adapter 200 in conjunction with additional elements of the rack system 100 such as the network switch 108, the cables 178 and 180, and the power bars 114. The rack adapter 200 is similar to the rack adapter 160 of FIGS. 1-7, but the rack adapter 200 includes a pass-through plate 202 that is disposed below the network switch 108, which is supported by a shelf 204. The pass-through plate 202 includes a plurality of pass-through jacks 206 disposed within the plate. The pass-through jacks 206 are similar to the pass-through jacks 174 and 176 in that they each include a front port facing the front opening of the frame 102 and a rear port facing the rear opening of the frame, where each front port is electrically coupled to a respective a rear port. In the illustrated embodiment, the rear ports of two of the pass-through jacks 206 are communicatively coupled to the management ports 168 and 170 of the switch 108 via the cables 178 and 180. Like the front ports of the pass-through jacks 174 and 176, the front ports of the pass-through jacks 206 may be any type of port found on computing devices, and, in some instances, may match the back-side ports of a computing device supported by the rack adapter 200. Because the pass-through plate 202 has a greater surface area than the pass-through plate 172, it may include a greater number of pass-through jacks. In one instance, the pass-through plate 202 has a width that is substantially equal to the width of the front opening 103 of the rack frame. Further, as shown in the illustrated embodiment of FIG. 8, the shelf 204 may include an aperture 208 through which the cables 178 and 180 pass so that they may connect to the pass-through jacks 206.

Figure 9:
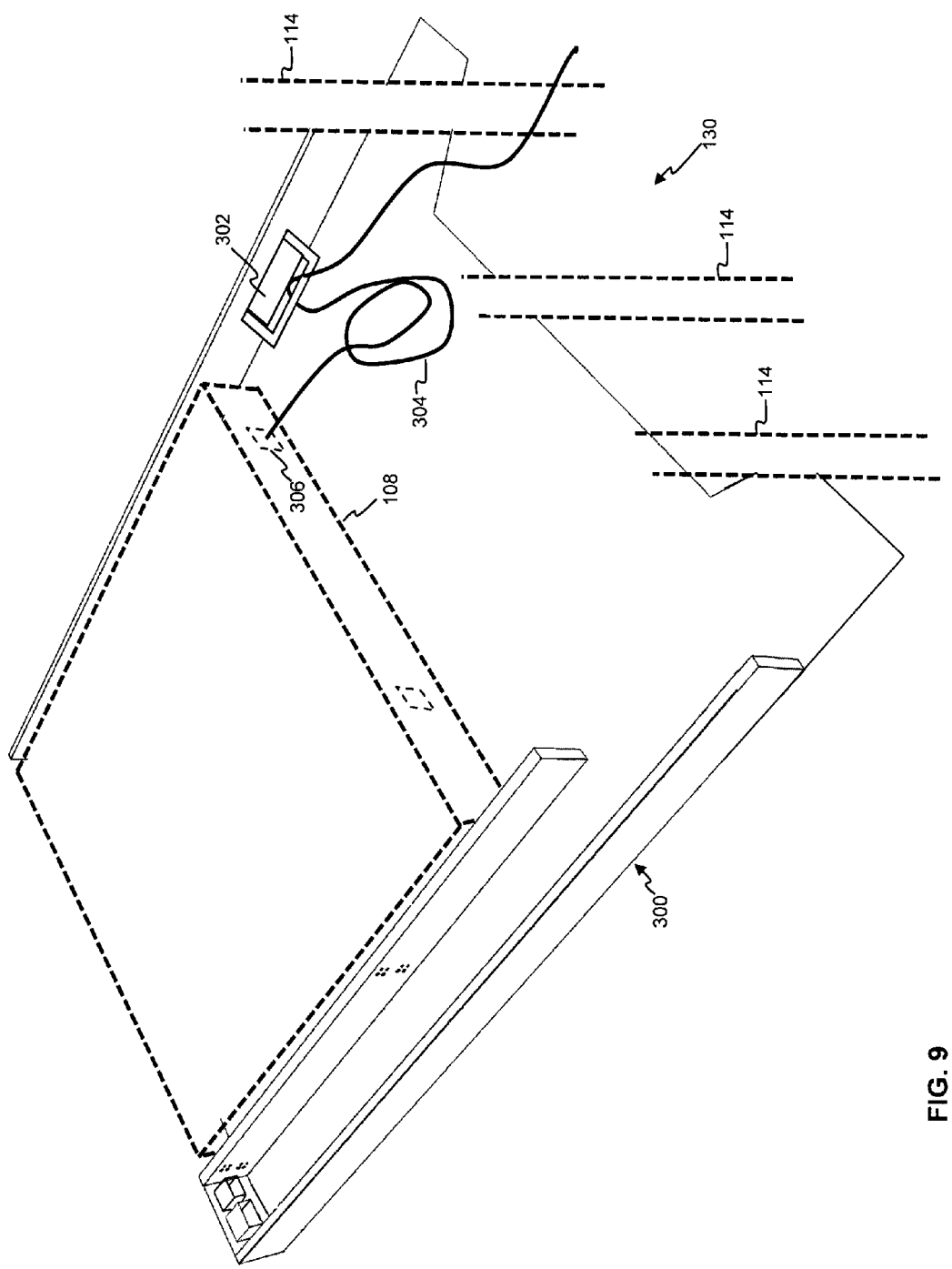
FIG. 9 is a diagrammatic perspective view of a rack adapter yet according to another embodiment of the present disclosure.

Referring now to FIG. 9, illustrated is a rack adapter 300 according to another embodiment of the present disclosure. The rack adapter 300 is similar to the rack adapter 160 of FIGS. 1-7 but further includes a cable retainer 302. The cable retainer 302 is configured to releasably secure a mid-section of a cable against movement. That is, once a cable has been secured within the cable retainer 302, a pulling force on either end of the cable will not yield movement of the cable in either direction. It should be understood that the cable retainer 302 depicted in FIG. 9 has been simplified for illustration purposes and may not represent an actual physical form. For instance, the cable retainer 302 may take on a variety of physical forms and may releasably secure a cable in a variety of manners, for instance, through clamps, springs, tensioners, latches, fasteners, and the like. As configured in the rack adapter 300, the cable retainer 302 may releasably secure a cable 304 of the network switch 108. In the illustrated embodiment of FIG. 9, one end of the cable 304 couples to a port 306 (for example, a power supply port) of the network switch 108 and the other end of the cable couples extends through the rear opening 130 of the rack frame 102 and couples to another device (for example, a power source). The cable retainer 302 secures the cable 304 from movement such that when the switch is removed through the front opening 103 of the frame, any tension created in the cable 304 will stop at the cable retainer. That is, the cable retainer 302 prevents such tension from pulling the opposite end of the cable out of the device to which it's coupled (for example, a power source). In this manner, maintenance of the network switch 108 that requires the switch to be pulled out of the front opening of the rack frame may be performed without worry that cables may become disconnected from devices that may be otherwise inaccessible, for instance, because of the power bars 114.

Even though illustrative embodiments have been shown and described, a wide range of modification, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. A rack adapter apparatus, comprising:
    a shelf configured to be mounted in a rack frame having a front opening of a first width and a rear opening of the first width, the shelf being further configured to support a computing device thereon, the computing device having a second width less than the first width and having a back-side port disposed thereon, the back-side port facing the rear opening when the computing device is supported by the shelf and the shelf is mounted in the rack frame;
    a pass-through plate coupled to the shelf, the pass-through plate facing the front opening; and
    a pass-through jack disposed within the pass-through plate, the pass-through jack having a front port facing the front opening and a rear port facing the rear opening, the front and rear ports being electrically coupled, and the rear port being configured to be communicatively coupled to the back-side port of the computing device such that electrical signals input into the front port are passed to the back-side port.

2. The rack adapter apparatus of claim 1, further including a cable communicatively coupling the back-side port to the rear port.

3. The rack adapter apparatus of claim 1,
    wherein the pass-through plate has a third width that is approximately the difference between the first width and the second width, the pass-through plate being disposed horizontally adjacent to a front face of the computing device when the computing device is supported on the shelf.

4. The rack adapter apparatus of claim 1,
    wherein the pass-through plate is coupled to the shelf such that the pass-through plate is beneath the computing device when the computing device is supported on the shelf.

5. The rack adapter apparatus of claim 4,
    wherein the shelf includes an aperture through which a cable communicatively coupling the back-side port to the rear port may pass.

6. The rack adapter apparatus of claim 4,
    wherein the pass-through plate has a third width that is approximately equal to the first width.

7. The rack adapter apparatus of claim 1, wherein the back-side port is the same port type as the front port.

8. The rack adapter apparatus of claim 1,
    wherein the front port is one of an RJ-45 port, an RJ-11 port, a DE-9 port, a DB-25 port, a USB port, an IEEE 1394 port, a PS/2 port, an HDMI port, a VGA port, a DVI port, a parallel port, and a SCSI port.

9. The rack adapter apparatus of claim 1,
    further including a cable retainer configured to releasably secure a mid-section of a cable coupled to the computing device against movement.

10. The rack adapter apparatus of claim 1,
    wherein the computing device is a network switch and the back-side port is a serial-based console port.

11. The rack adapter apparatus of claim 1,
    wherein the rack frame includes energized power bars disposed adjacent the rear opening, the power bars rendering the back-side port at least partially inaccessible when the computing device is supported by the shelf and the shelf is mounted in the rack frame.

12. A rack adaptation method, comprising:
    providing a rack adapter having a shelf configured to be mounted in a rack frame having a front opening of a first width and a rear opening of the first width, the shelf having a pass-through plate coupled thereto, the pass-through plate facing the front opening, the pass-through plate having a pass-through jack disposed therein, and the pass-through jack having a front port facing the front opening and a rear port facing the rear opening, the front and rear ports being electrically coupled;
    supporting a computing device with the shelf when the shelf is mounted in the rack frame, the computing device having a second width less than the first width and having a back-side port disposed thereon, the back-side port facing the rear opening;
    communicatively coupling the back-side port to the rear port of the pass-through jack; and
    passing, via the pass-through jack, electrical signals input into the front port to the back-side port.

13. The rack adaptation method of claim 12,
    wherein the communicatively coupling includes coupling the back-side port to the rear port with a cable.

14. The rack adaptation method of claim 12,
    wherein the pass-through plate has a third width that is approximately the difference between the first width and the second width, the pass-through plate being disposed horizontally adjacent to a front face of the computing device when the computing device is supported on the shelf.

15. The rack adaptation method of claim 12, wherein the pass-through plate is coupled to the shelf such that the pass-through plate is beneath the computing device when the computing device is supported on the shelf.

16. The rack adaptation method of claim 15, wherein the shelf includes an aperture through which a cable communicatively coupling the back-side port to the rear port may pass.

17. The rack adaptation method of claim 15, wherein the pass-through plate has a third width that is approximately equal to the first width.

18. The rack adaptation method of claim 12, wherein the back-side port is the same port type as the front port.

19. The rack adaptation method of claim 12, wherein the front port is one of an RJ-45 port, an RJ-11 port, a DE-9 port, a DB-25 port, a USB port, an IEEE 1394 port, a PS/2 port, an HDMI port, a VGA port, a DVI port, a parallel port, and a SCSI port.

20. The rack adaptation method of claim 12, wherein providing the rack adapter includes providing a rack adapter having a cable retainer configured to releasably secure a mid-section of a cable coupled to the computing device against movement.

21. The rack adaptation method of claim 12, wherein the computing device is a network switch and the back-side port is a serial-based console port.

22. The rack adaptation method of claim 12, wherein the rack frame includes energized power bars disposed adjacent the rear opening, the power bars rendering the back-side port at least partially inaccessible when the computing device is supported by the shelf and the shelf is mounted in the rack frame.

23. A rack adapter apparatus, comprising:
a shelf configured to be mounted in a rack frame having a front opening of a first width and a rear opening of the first width, the shelf being further configured to support a network switch thereon, the network switch having a second width less than the first width and having a management port and a console port disposed thereon, the management and console ports facing the rear opening when the network switch is supported by the shelf and the shelf is mounted in the rack frame;
a pass-through plate coupled to the shelf, the pass-through plate facing the front opening; and
first and second pass-through jacks disposed within the pass-through plate, the pass-through jacks each having front ports facing the front opening and rear ports facing the rear opening, the front and rear ports being electrically respectively coupled, and the rear ports being configured to be communicatively coupled to the respective management and console ports of the network switch such that electrical signals input into the front ports are passed to the respective management and console ports.

24. The rack adapter apparatus of claim 23, wherein the management port, the console port, and the front ports are RJ-45 ports.

25. The rack adapter apparatus of claim 23, further including a first unshielded twisted-pair cable communicatively coupling the management port to one of the rear ports and a second unshielded twisted-pair cable communicatively coupling the console port to the other one of the rear ports.

* * * * *